United States Patent
Li et al.

(10) Patent No.: US 9,647,001 B2
(45) Date of Patent: May 9, 2017

(54) ARRAY SUBSTRATE, METHOD FOR FABRICATING THE SAME AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fuqiang Li, Beijing (CN); Xuelu Wang, Beijing (CN); Cheng Li, Beijing (CN); Seong Jun An, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 56 days.

(21) Appl. No.: 14/361,577

(22) PCT Filed: Dec. 13, 2013

(86) PCT No.: PCT/CN2013/089316
§ 371 (c)(1),
(2) Date: May 29, 2014

(87) PCT Pub. No.: WO2015/032149
PCT Pub. Date: Mar. 12, 2015

(65) Prior Publication Data
US 2015/0060863 A1    Mar. 5, 2015

(30) Foreign Application Priority Data
Sep. 5, 2013 (CN) .......................... 2013 1 0400101

(51) Int. Cl.
| H01L 27/12 | (2006.01) |
| H01L 29/786 | (2006.01) |
| G02F 1/1362 | (2006.01) |

(52) U.S. Cl.
CPC ...... *H01L 27/124* (2013.01); *G02F 1/136213* (2013.01); *H01L 27/1222* (2013.01);
(Continued)

(58) Field of Classification Search
CPC ......... G02F 1/134363; G02F 1/136209; G02F 1/136213; G02F 1/136286; G02F 1/1368;
(Continued)

(56) References Cited

U.S. PATENT DOCUMENTS

| 9,343,481 B2 * | 5/2016 | Zhou ..................... H01L 27/124 |
| 2013/0300968 A1 * | 11/2013 | Okajima ........... G02F 1/136209 349/43 |
| 2015/0277172 A1 * | 10/2015 | Sekine ................ G02F 1/13306 349/43 |

FOREIGN PATENT DOCUMENTS

| CN | 203521429 U | 4/2014 |
| WO | 2012102158 A1 | 8/2012 |

OTHER PUBLICATIONS

Second Chinese Office Action Appln. No. 201310400101.3; Dated Jul. 20, 2015.
(Continued)

*Primary Examiner* — William F Kraig
*Assistant Examiner* — Edward Chin
(74) *Attorney, Agent, or Firm* — Ladas & Parry LLP (57) ABSTRACT

An array substrate, a method for fabricating the same and a display device are disclosed. The array substrate includes a base substrate, and further includes a metal shield layer, a semiconductor layer, a gate insulation layer, a gate metal layer, an interlayer dielectric layer, a source-drain metal
(Continued)

layer and a pixel electrode layer sequentially formed on the base substrate. At least one first via hole penetrating to the metal shield layer is formed in the interlayer dielectric layer and the gate insulation layer. The source-drain metal layer is formed in the at least one first via hole and on the interlayer dielectric layer having the at least one first via hole.

20 Claims, 7 Drawing Sheets (52) U.S. Cl.
CPC .... *H01L 27/1255* (2013.01); *G02F 1/136209* (2013.01); *G02F 1/136227* (2013.01); *G02F 2201/40* (2013.01); *H01L 29/78696* (2013.01)

(58) Field of Classification Search
CPC ........ G02F 2001/133397; G02F 2001/134372; G02F 2201/124; G02F 2201/40; G02F 2202/16; G02F 2203/09; H01L 27/124; H01L 29/78; H01L 27/1248; H01L 27/1296; H01L 29/78609; H01L 29/78633; H01L 29/78648
USPC .................................. 257/57, 71, 66; 349/43
See application file for complete search history.

(56) References Cited

OTHER PUBLICATIONS

Third Chinese Office Action dated Jan. 12, 2016; Appln. No. 201310400101.3.
International Preliminary Report on Patentability issued Mar. 8, 2016; PCT/CN2013/089316.
International Search Report Issued Jun. 18, 2014; Appln. No. PCT/CN2013-089316.

* cited by examiner

ARRAY SUBSTRATE, METHOD FOR FABRICATING THE SAME AND DISPLAY DEVICE

FIELD OF THE ART

Embodiments of the invention relate to the field of display technologies, more particularly, to an array substrate, a method for fabricating the same and a display device.

BACKGROUND

With the continuous development of the Thin Film Transistor Liquid Crystal Display (TFT-LCD) technology, TFT display devices based on the Low Temperature Poly-silicon (LTPS) technology and having the advantages of low power consumption, high resolution, fast response speed and high aperture ratio gradually become the mainstream display and have been widely used in various electronic devices, such as a liquid crystal television, a smart phone, a tablet PC and a digital camera and other digital electronic devices.

However, in high resolution products such as the TFT display devices based on the LTPS technology, the ever increasing of the resolution and the aperture ratio of the products will cause the pixel pitch of the array substrate of the LTPS TFT display device to become even smaller, which will in turn make the storage capacitance of the array substrate smaller. With the same drain current, smaller storage capacitance of the LTPS TFT array substrate will make the voltage holding ratio of the pixel lower, which will further cause defects such as flicker, thereby severely reducing the quality of the array substrate or the high resolution products such as the TFT display device. Therefore, a problem to be solved urgently in the industry is to increase the storage capacitance while not affecting the aperture ratio of the array substrate.

SUMMARY

Embodiments of the invention provide an array substrate, a method for fabricating the same and a display device.

A first aspect of the disclosure provides an array substrate, which comprises a base substrate, and further comprises a metal shield layer, a semiconductor layer, a gate insulation layer, a gate metal layer, an interlayer dielectric layer, a source-drain metal layer and a pixel electrode layer sequentially formed on the base substrate, wherein at least one first via hole penetrating to the metal shield layer is formed in the interlayer dielectric layer and the gate insulation layer; the source-drain metal layer is formed in the at least one first via hole and on the interlayer dielectric layer having the at least one first via hole.

As an example, the source-drain metal layer overlays an inner wall of the at least one first via hole and is electrically connected to the metal shield layer.

As an example, a cross section of the at least one first via hole is in the shape of a circle, a square, a triangle or a trapezoid.

As an example, the array substrate further comprises:
a buffer layer formed between the metal shield layer and the semiconductor layer, the at least one first via hole is formed in the interlayer dielectric layer, the gate insulation layer and the buffer layer.

As an example, the source-drain metal layer comprises patterns of a source electrode, a drain electrode and a data line.

As an example, a source electrode via hole and a drain electrode via hole configured for electrically connecting the semiconductor layer respectively to the source electrode and the drain electrode are formed in both the interlayer dielectric layer and the gate insulation layer.

As an example, the array substrate further comprises:
a planarized layer, a common electrode layer and a passivation layer sequentially formed between the source-drain metal layer and the pixel electrode layer;
wherein a second via hole and a third via hole which correspond to each other and penetrate to the source-drain metal layer are respectively formed in the planarized layer and the passivation layer;
the pixel electrode layer is formed in the third via hole and on the passivation layer having the third via hole.

As an example, the semiconductor layer is a polycrystalline silicon layer.

As an example, the gate metal layer comprises patterns of a gate electrode, a gate line and a common electrode line.

A second aspect of the invention provides a display device comprising the above array substrate.

A third aspect of the invention provides a method for fabricating an array substrate, comprising:
sequentially forming a metal shield layer, a semiconductor layer, a gate insulation layer, a gate metal layer, an interlayer dielectric layer on a base substrate;
forming at least one first via hole in the interlayer dielectric layer and the gate insulation layer, the at least one first via hole penetrating to the metal shield layer;
forming a source-drain metal layer in the at least one first via hole and on the interlayer dielectric layer having the at least one first via hole.

As an example, the method further comprises forming a pixel electrode layer above the source-drain metal layer.

As an example, the semiconductor layer is a polycrystalline silicon layer; the method further comprises the following step after forming the metal shield layer and before forming the semiconductor layer:
forming a buffer layer on the metal shield layer, wherein the at least one first via hole is formed in the interlayer dielectric layer, the gate insulation layer and the buffer layer.

As an example, the source-drain metal layer comprises patterns of a source electrode, a drain electrode and a data line; the method further comprising the following step after forming the interlayer dielectric layer and before forming the source-drain metal layer:
forming a source electrode via hole and a drain electrode via hole in the interlayer dielectric layer and the gate insulation layer, the source electrode via hole and the drain electrode via hole being configured for electrically connecting the semiconductor layer respectively to the source electrode and the drain electrode.

As an example, the method further comprises the following step after forming the source-drain metal layer in the first via hole and on the interlayer dielectric layer having the first via hole and before forming the pixel electrode layer above the source-drain metal layer:
sequentially forming a planarized layer, a common electrode layer and a passivation layer on the source-drain metal layer;
wherein a second via hole and a third via hole which correspond to each other and penetrate to the source-drain metal layer are respectively formed in the planarized layer and the passivation layer;
forming the pixel electrode layer above the source-drain metal layer comprises:

forming the pixel electrode layer in the third via hole and on the passivation layer having the third via hole.

In the technical solution in accordance with the embodiments of the invention, the via hole penetrating directly to the metal shield layer is disposed in the interlayer dielectric layer, which allows the pixel electrode on the SD metal layer to be electrically connected to the metal shield layer, and further allows the common electrode line in the gate metal layer to form the storage capacitances not only with the SD metal layer but also with the metal shield layer, thereby increasing the storage capacitance of the array substrate, improving the voltage holding ratio of the pixel of the array substrate and eliminating defects such as flicker of the array substrate, thus, the quality of the array substrate and of the display device are both increased.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

Figure 1:
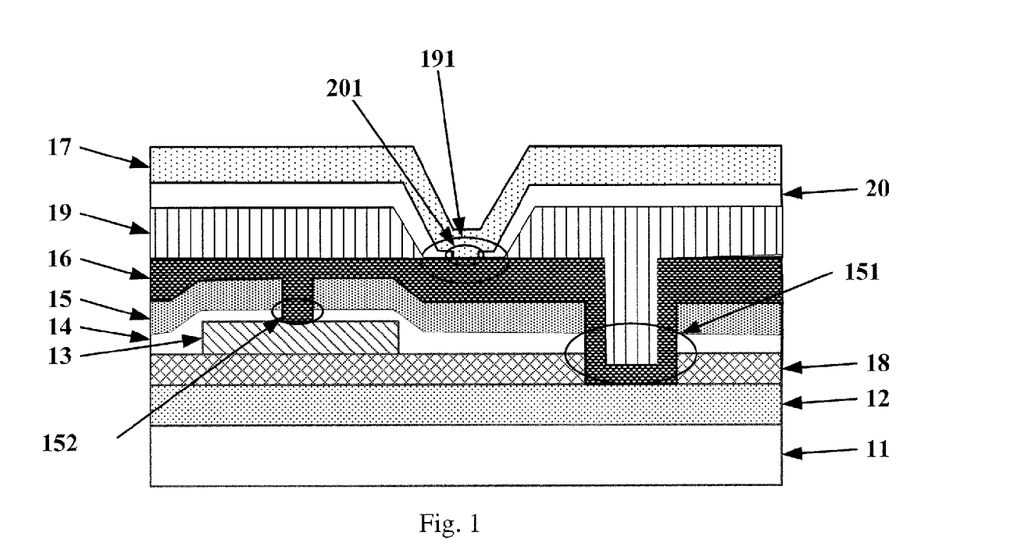
FIG. 1 schematically illustrates a cross section of an array substrate in accordance with Embodiment 1 of the invention.

FIG. 1 is a cross-section structural schematic diagram of an array substrate in accordance with Embodiment 1 of the invention. The array substrate comprises: a base substrate 11; and further comprises: a metal shield layer 12, a semiconductor layer 13, a gate insulation layer 14, a gate metal layer (not shown in FIG. 1), an interlayer dielectric layer 15, a source-drain (SD) metal layer 16 and a pixel electrode layer 17 sequentially formed on the base substrate 11.

In the embodiment, at least one first via hole 151 penetrating to the metal shield layer 12 is formed in the interlayer dielectric layer 15 and the gate insulation layer 14; the SD metal layer 16 is formed in the at least one first via hole 151 (for example on an inner wall of the via hole and electrically connected to the metal shield layer 12 at the bottom thereof) and on the interlayer dielectric layer 15 having the at least one first via hole 151.

The gate metal layer may comprise patterns of a gate electrode, a gate line and a common electrode line; the SD metal layer 16 may comprise patterns of a source electrode, a drain electrode and a data line, which will not be elaborated in the disclosure.

The semiconductor layer 13 may be a polycrystalline silicon layer or an amorphous silicon layer. For example, in an embodiment of the invention, the semiconductor layer 13 is a polycrystalline silicon layer.

The array substrate may further comprise: a buffer layer 18 formed between the metal shield layer 12 and the semiconductor layer 13, the first via hole 151 is formed in the interlayer dielectric layer 15, the gate insulation layer 14 and the buffer layer 18, that is, the first via hole 151 sequentially penetrates through three layers: the interlayer dielectric layer 15, the gate insulation layer 14 and the buffer layer 18. For the convenience of description, the respective via holes in the three layers are collectively referred to as the first via hole 151.

The array substrate may further comprise: a planarized layer 19, a common electrode layer (not shown in FIG. 1) and a passivation layer 20, which are sequentially formed between the SD metal layer 16 and the pixel electrode layer 17.

Herein, a second via hole 191 and a third via hole 201 which correspond to each other and penetrate to the SD metal layer 16 are respectively formed in the planarized layer 19 and the passivation layer 20; the pixel electrode layer 17 is formed in the third via hole 201 and on the passivation layer 20 having the third via hole 201.

It is noted that in the embodiment of the invention, the second via hole 191 and the third via hole 201 which correspond to each other means that the third via hole 201 is formed in a portion of the passivation layer 20 that is disposed on bottom of the second via hole 191, that is, there is an overlapping region between a horizontal projection region of the third via hole 201 on the base substrate 11 and that of the second via hole 191 on the base substrate 11. Accordingly, a size of the third via hole 201 is smaller than that of the second via hole 191, as illustrated in FIG. 1

That is to say, in the embodiment of the invention, the pixel electrode layer 17 is electrically connected to the SD metal layer 16 by way of the third via hole 201. Moreover, due to the existence of the first via hole 151, the SD metal layer 16 may be electrically connected to the metal shield layer 12. Therefore, in the embodiment of the invention, the pixel electrode layer 17 may be electrically connected to the metal shield layer 12, thereby allowing the common electrode line in the gate metal layer to form storage capacitors not only with the SD metal layer 16 but also with the metal shield layer 12, which increases the storage capacitance of the array substrate, improves the voltage holding ratio of the pixel of the array substrate and eliminates defects such as flicker of the array substrate, thereby improving the quality of the array substrate and the display device.

In the following, the configuration of the array substrate adaptable for a dual-gate LTPS TFT will be described in detail with reference to FIGS. 2(a) to 2(i). It is noted that the array substrate in all of the embodiments is also adaptable for a single-gate LTPS TFT, which will not be limited by the embodiments of the invention. Moreover, it is noted that the respective layer structures in plan views of FIGS. 2(a) to 2(i) are transparent or semi-transparent for clear illustration purpose.

Figure 2A:
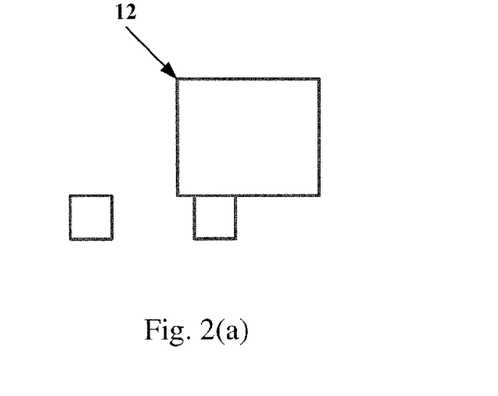
FIG. 2(a) schematically illustrates a planar configuration of a metal shield layer in accordance with Embodiment 1 of the invention.

As illustrated in FIG. 2(a), it is a schematic planar configuration of the metal shield layer 12 in the embodiment of the invention. The metal shield layer 12 is formed on the base substrate 11, and configured to shield the TFT channel, so as to reduce the influence on the TFT by a backlight source. For example, the metal shield layer 12 may be an aluminum layer, a tungsten layer, a chrome layer or an electro-conductive layer of other metals or metal compounds, which will not be limited by the embodiments of the invention.

The buffer layer 18 is formed on the metal shield layer 12; the buffer layer 18 may be configured to prevent substances in the base substrate 11 from diffusing into individual layer structures above the base substrate in subsequent processes (such as high-temperature crystallization), which may compromise the quality of the fabricated array substrate or the LTPS TFT. It can be contemplated that, in some embodiments, if the base substrate is an alkali free glass or other specially processed substrates, the buffer layer can be omitted. In this case, the first via hole merely penetrates through the interlayer dielectric layer 15 and the gate insulation layer 14 to reach the metal shield layer 12.

The buffer layer 18 may have a dual-layer insulation structure comprising a silicon nitride film layer and a silicon oxide film layer, or a single layer insulation structure comprising a silicon nitride film layer or a silicon oxide film layer, which is not limited by the embodiments of the invention. Moreover, as the buffer layer 18 may overlay the whole base substrate 11, no detailed illustration of the planar structure of the buffer layer 18 is provided in the embodiment of the invention.

Figure 2B:
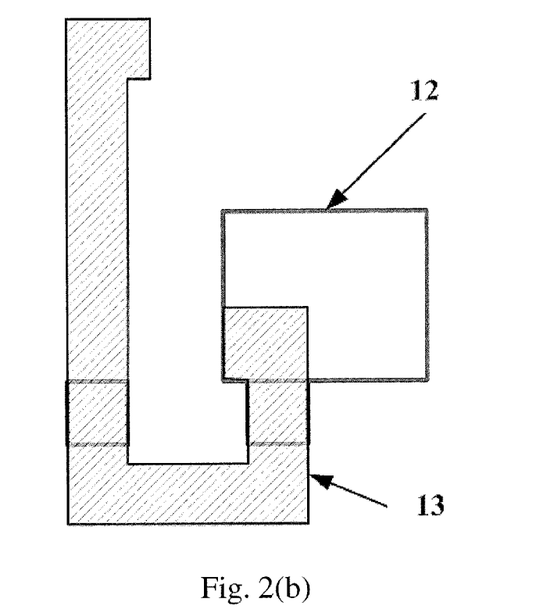
FIG. 2(b) schematically illustrates a planar configuration of a semiconductor layer in accordance with Embodiment 1 of the invention.

As illustrated in FIG. 2(b), it is a schematic planar configuration of the semiconductor layer 13 in the embodiment of the invention. The semiconductor layer 13 may be formed on the buffer layer 18, and there may be multiple overlapping regions between a horizontal projection region of the semiconductor layer 13 on the base substrate 11 and that of the metal shield layer 12 on the base substrate 11. For example, there may be an overlapping region between the horizontal projection region of the TFT gate in the semiconductor layer 13 on the base substrate 11 and that of the metal shield layer 12 on the base substrate 11.

The gate insulation layer 14 is formed on the semiconductor layer 13. The gate insulation layer 14 may be a silicon oxide layer, a silicon nitride layer or a composite insulation layer comprising a silicon oxide layer and a silicon nitride layer, which will not be limited by the embodiments of the invention. Moreover, the gate insulation layer 14 may overlay the whole base substrate 11 and via holes in the gate insulation layer 14 may be formed in some regions, such as in peripheral tracing region. No detailed illustration of the planar structure of the gate insulation layer 14 is provided in the embodiment of the invention.

Figure 2C:
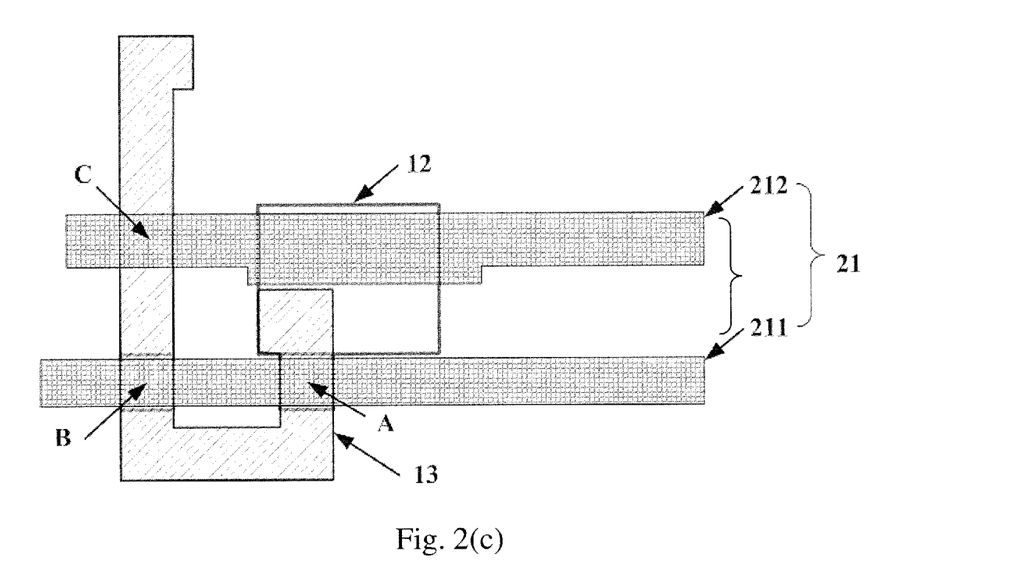
FIG. 2(c) schematically illustrates a planar configuration of a gate metal layer in accordance with Embodiment 1 of the invention.

As illustrated in FIG. 2(c), it is a schematic planar configuration of the gate metal layer (indicated by the numeral 21 in FIG. 2(c)) in the embodiment of the invention. The gate metal layer is formed on the gate insulation layer 14, and comprises two parts, a part being the gate electrode and the gate line (Gate, numeral 211), the other part being the common electrode line (Gate Metal Vcom, numeral 212). In FIG. 2(c), there are three overlapping regions A, B and C between the horizontal projection region of the gate metal layer 21 on the base substrate 11 and that of the semiconductor layer 13 on the base substrate 11, wherein regions A and B are locations where the gate electrode is disposed.

It is noted that, in the embodiment of the invention, patterns of the gate electrode, the gate line and the common electrode line in the gate metal layer may be formed simultaneously through a single patterning process, and a material of the gate metal layer may be aluminum, tungsten, chrome or other metals and metal compounds, which will not be limited by the disclosure. It is further noted that the common electrode line may form a storage capacitor with the semiconductor layer 13 or with the pixel electrode layer 17, thereby increasing the storage capacitance of the array substrate.

The interlayer dielectric layer 15 is formed on the gate metal layer, so as to protect the pattern formed by the gate metal layer and isolate the gate metal layer 21 from the subsequently formed SD metal layer 16. The interlayer dielectric layer 15 may overlay the whole base substrate 11 or just form pattern which isolates the gate metal layer 21 from the subsequently formed SD metal layer 16. No detailed illustration of the planar structure of the interlayer dielectric layer 15 is provided in the embodiment of the invention.

Figure 2D:
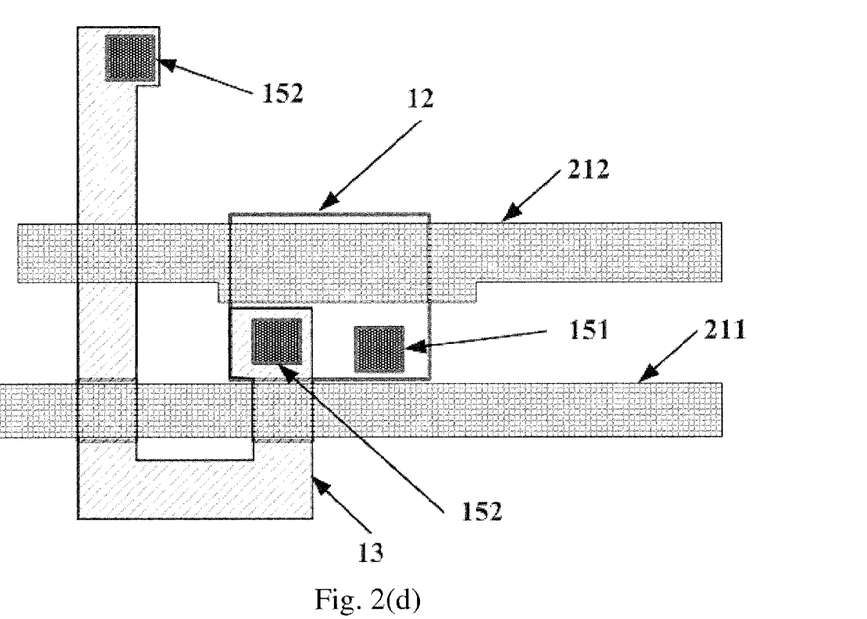
FIG. 2(d) schematically illustrates a planar configuration of a first via hole in accordance with Embodiment 1 of the invention.

As illustrated in FIG. 2(d), at least one first via hole 151 penetrating to the metal shield layer 12 may be formed in the interlayer dielectric layer 15, the gate insulation layer 14 and the buffer layer 18; a cross section of the first via hole 151 may be in the shape of a circle, a square, a triangle, a trapezoid or other polygon, which will not be limited by the embodiment of the invention. Moreover, a size of the first via hole 151 is adjustable, which will not be limited by the embodiment of the invention, so as to be adaptable to different process conditions, and to improve the flexibility and practicality of the fabrication processes.

As illustrated in FIG. 2(d), the cross section of the first via hole 151 is in the shape of a square, and the horizontal projection region of the first via hole 151 on the base substrate 11 does not overlap with the horizontal projection regions of the semiconductor layer 13 and the gate metal layer 12 on the base substrate 11.

Moreover, it is further noted that a source electrode via hole and a drain electrode via hole (indicated with the numeral 152) for electrically connecting the semiconductor layer 13 respectively to the TFT source electrode and the TFT drain electrode may further be formed in the interlayer dielectric layer 15 and the gate insulation layer 14, which will not be elaborated in embodiments of the invention.

Figure 2E:
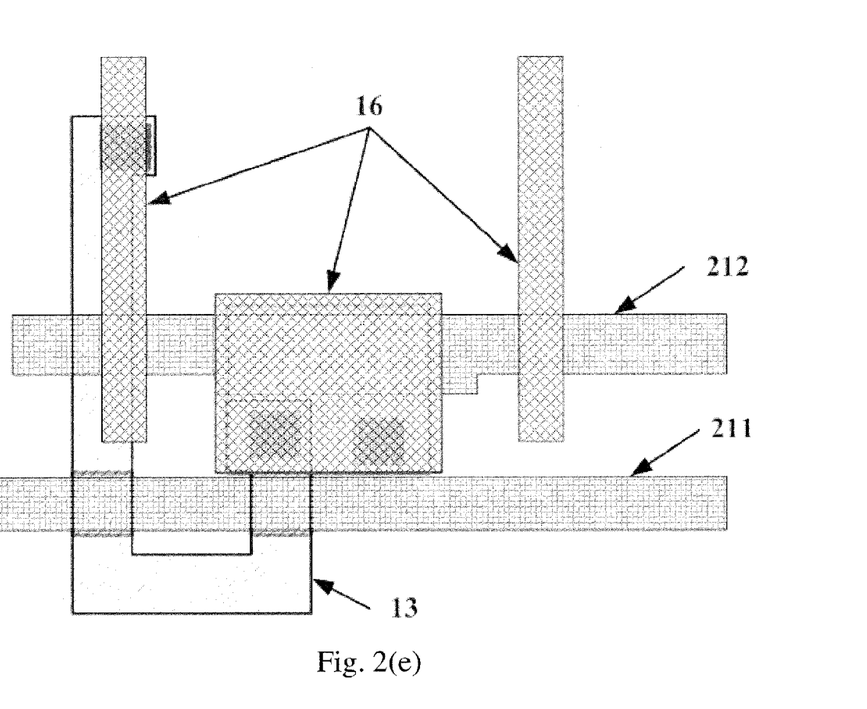
FIG. 2(e) schematically illustrates a planar configuration of a source-drain metal layer in accordance with Embodiment 1 of the invention.

As illustrated in FIG. 2(e), it is a schematic planar configuration of the SD metal layer 16 in the embodiment of the invention. The SD metal layer 16 is formed on the interlayer dielectric layer 15, and may comprise two parts: one part being a strip metal layer, normally referred to as the data line, the other part being a square metal layer, normally referred to as the SD pad, wherein the horizontal projection region of the SD pad on the base substrate 11 overlaps that of the first via hole 151 on the base substrate 11, that is, the first via hole 151 is formed in the interlayer dielectric layer 15, the gate insulation layer 14 and the buffer layer 18 under the SD pad. It is noted that the drawings in the embodiments of the invention are for illustrative purpose only, while shapes, sizes and location relationships do not intend to limit the embodiments of the invention.

A planarized layer 19 is formed on the SD metal layer 16; the planarized layer 19 may protect the SD metal layer 16 and planarize the surface of the array substrate. The planarized layer 19 may be an insulation layer made of an inorganic material or an organic material, which will not be limited by the embodiments of the invention.

As an example, the planarized layer 19 is made of an organic resin material; the organic resin material may be Benzocyclobutene (BCB), or other organic photosensitive material, which will not be limited by the embodiments of the invention. As the organic resin has a smaller hardness than inorganic materials, it makes the planarization of the surface of the array substrate easier, which is beneficial to the subsequent formation of the common electrode layer and the pixel electrode layer 17 as well as the ideal arrangement of liquid crystal molecules between a color filter substrate and the array substrate.

Figure 2F:
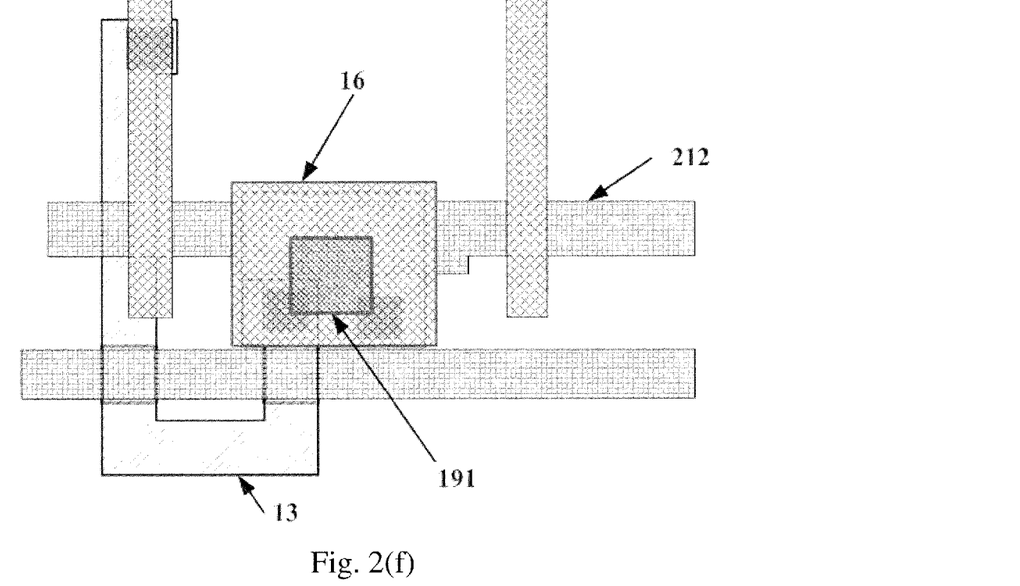
FIG. 2(f) schematically illustrates a planar configuration of a planarized layer via hole in accordance with Embodiment 1 of the invention.

The planarized layer via hole 191 (a second via hole) penetrating to the SD metal layer 16 may be formed in the planarized layer 19; a planar configuration of the planarized layer via hole 191 is illustrated in FIG. 2(f). A cross section of the planarized layer via hole 191 may be in the shape of a circle, a square, a triangle, a trapezoid or other polygon, which will not be limited by the embodiment of the invention. In FIG. 2(f), the planarized layer via hole 191 is for example in the shape of a square.

Figure 2G:
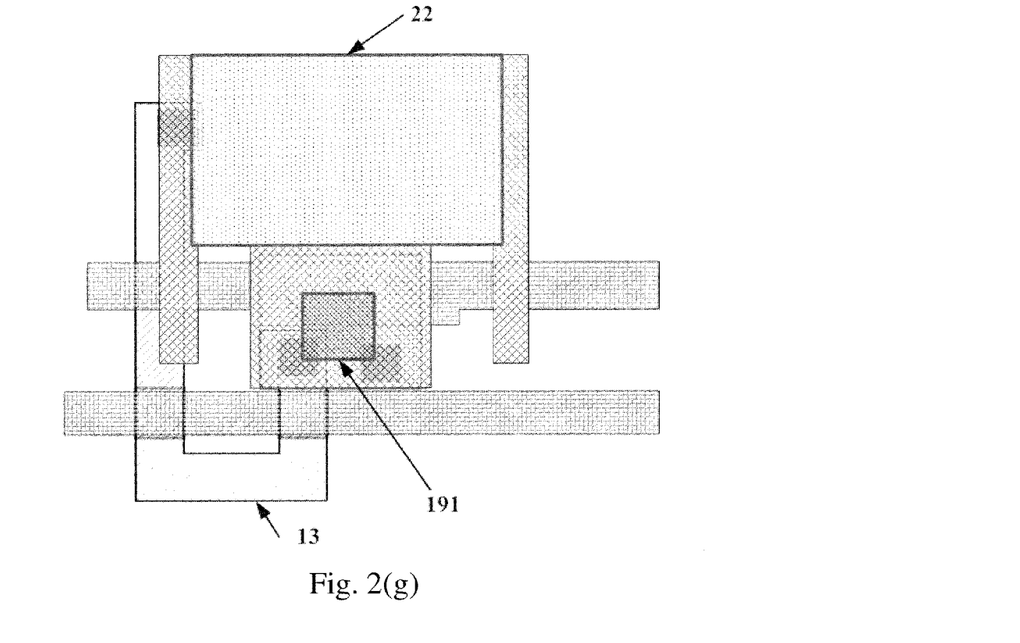
FIG. 2(g) schematically illustrates a planar configuration of a common electrode layer in accordance with Embodiment 1 of the invention.

A common electrode layer is formed on the planarized layer 19, and a schematic planar configuration of the common electrode layer is illustrated in FIG. 2(g) (the common electrode layer indicated with the numeral 22 in FIG. 2(g)). The common electrode layer 22 may be for example formed through a single patterning process, and a material of the common electrode layer 22 may be a transparent electro-conductive film material, such as ITO, AZO, which will not be limited in the embodiment of the invention.

Figure 2H:
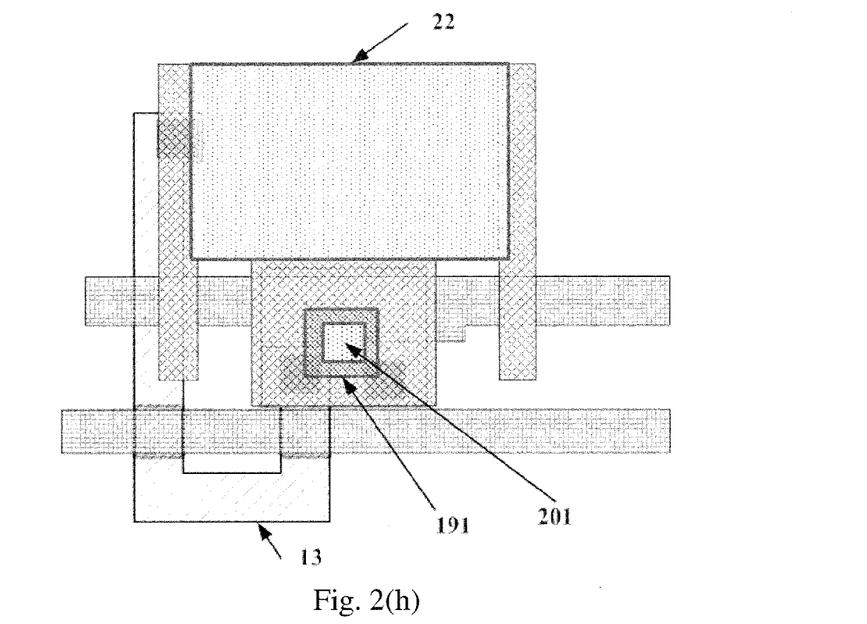
FIG. 2(h) schematically illustrates a planar configuration of a passivation layer via hole in accordance with Embodiment 1 of the invention.

A passivation layer 20 is formed on the common electrode layer 22, and the passivation layer via hole 201 (a third via hole) corresponding to the planarized layer via hole 191 and penetrating to the SD metal layer 16 may be formed in the passivation layer 20; a planar configuration of the formed passivation layer via hole 201 is illustrated in FIG. 2(h).

It is noted that the size of the passivation layer via hole 201 is normally smaller than that of the planarized layer via hole 191. Moreover, a cross section of the passivation layer via hole 201 may be in the shape of a circle, a square, a triangle, a trapezoid or other polygon, which will not be limited by the embodiment of the invention. In FIG. 2(h), the planarized layer via hole 191 is for example in the shape of a square.

It is noted that the passivation layer 20, similar to the planarized layer 19, may also be an insulation layer made of an inorganic material or an insulation layer made of an organic material, which will not be limited by the embodiments of the invention.

Figure 2I:
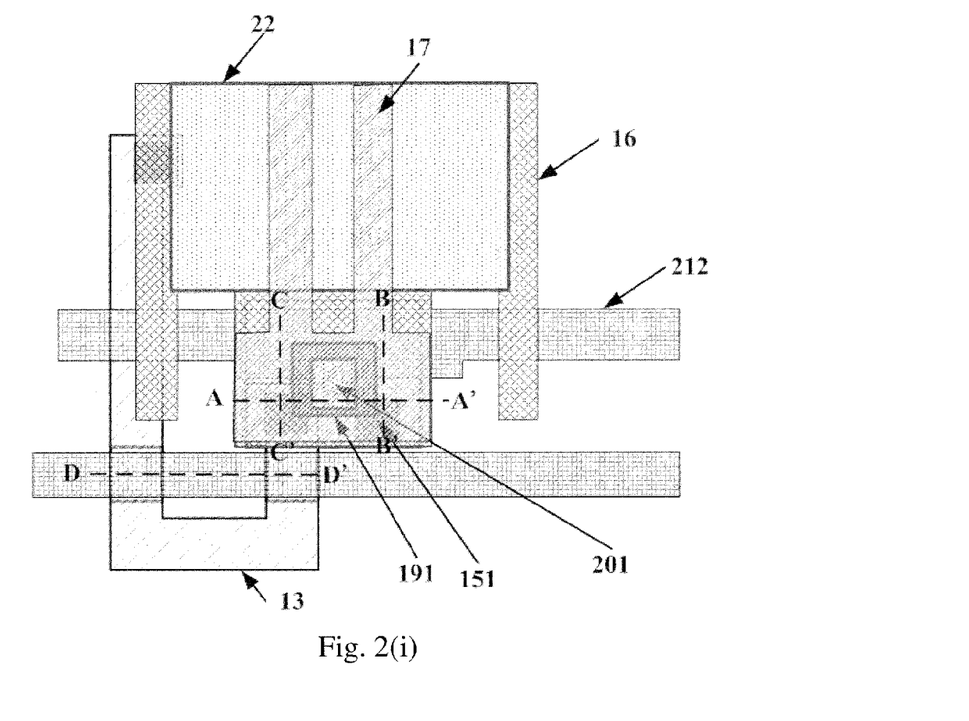
FIG. 2(i) schematically illustrates a planar configuration of a pixel electrode layer in accordance with Embodiment 1 of the invention.

As illustrated in FIG. 2(i), it is a schematic planar configuration of the pixel electrode layer 17 in the embodiment of the invention. The pixel electrode layer 17 may be formed in the third via hole 201 and on the passivation layer 20 having the third via hole 201, and be electrically connected to the metal shield layer 12 by way of the SD metal layer 16 in the first via hole 151, such that the common electrode line in the gate metal layer may be sandwiched between the SD metal layer 16 and the metal shield layer 12, allowing it to form storage capacitors with not only the SD metal layer 16 but also the metal shield layer 12. It can thereby increase the storage capacitance of the array substrate, improve the voltage holding ratio of the pixel of the array substrate and eliminate defects such as flicker of the array substrate, thereby improving the quality of the array substrate and the display device.

It is noted that patterns of individual layers of FIGS. 2(a) to 2(i) are intended to illustrate the embodiment of the invention, and it may be modified according to practical situations, which will not be limited by the embodiment of the invention.

Embodiment 1 of the invention further provides a display device comprising the above array substrate. The display device may be for example a LCD panel, an E-paper, an Organic Light-Emitting Diode (OLED) panel, a mobile phone, a tablet PC, a television, a display, a notebook PC, a digital photoframe, a navigator and any product or component having a display function, which will not be limited by the embodiment of the invention.

It is noted that the display device in accordance with the embodiment of the invention may work in a Twisted Nematic (TN) mode, a Vertical Alignment (VA) mode, an In-Plane Switching (IPS) mode, or an Advanced Super Dimension Switch (ADS) mode, which will not be limited by the embodiment of the invention. As an example, the display device in accordance with the embodiment of the invention is especially suitable for the IPS mode and the ADS mode.

In the array substrate and the display device provided by the above Embodiment 1 of the invention, the via hole penetrating directly to the metal shield layer and disposed in both the interlayer dielectric layer and the gate insulation layer allows the pixel electrode layer on the SD metal layer to be electrically connected to the metal shield layer, which further allows the common electrode line in the gate metal layer to form the storage capacitance with the SD metal layer and to form the storage capacitance with the metal shield layer, thereby increasing the storage capacitance of the array substrate, improving the voltage holding ratio of the pixel of the array substrate and eliminating defects such as flicker of the array substrate, thus the quality of the array substrate and the display device are both increased.

Embodiment 2

Embodiment 2 of the invention provides a method for fabricating the array substrate of Embodiment 1 of the invention. In the following, the method for fabricating the array substrate in accordance with Embodiment 2 of the invention will be described in connection with FIGS. 2(a) to 2(i). Taking an array substrate having a polycrystalline silicon semiconductor layer as an example, the fabrication method of the array substrate comprises the following steps:

Step 101: forming a metal shield layer 12 on a base substrate 11; a pattern of the metal shield layer 12 is for example illustrated in FIG. 2(a).

The base substrate 11 may be a glass substrate or a plastic substrate, which will not be limited by the embodiment of the invention.

Before forming the metal shield layer 12 on the base substrate 11, a pre-cleansing operation may be performed on the base substrate 11. After that, the metal shield layer 12 is formed on the base substrate 11. The metal shield layer 12 is configured to shield the TFT channel, so as to reduce the influence on the TFT by a backlight source. For example, the metal shield layer 12 may be an aluminum layer, a tungsten layer, a chrome layer or an electro-conductive layer of other metals or metal compounds, which will not be limited by the embodiment of the invention.

As an example, the step of forming the metal shield layer 12 on the base substrate 11 may comprise:

forming a metal layer on the base substrate 11 through deposition, sputtering and the like, and then forming a predefined pattern of the metal shield layer 12 through a patterning process. The patterning process comprising photoresist coating, exposing, developing, etching, photoresist peeling and so on, which will not be elaborated in the embodiment of the invention.

Step 102: forming a buffer layer 18 on the metal shield layer 12.

In the embodiment of the invention, the buffer layer 18 may be deposited on the metal shield layer 12 through Chemical Vapor Deposition (CVD) or other methods. The buffer layer 18 may have a dual-layer insulation structure comprising a silicon nitride film layer and a silicon oxide film layer, or a single layer insulation structure comprising a silicon nitride film layer or a silicon oxide film layer, which will not be limited by the embodiment of the invention. It can be contemplated that, in some embodiments, if the base substrate is an alkali free glass or other specially processed substrates, the buffer layer can be omitted. In this case, step 102 may be omitted.

Step 103: forming a semiconductor layer 13 on the buffer layer 18; a pattern of the semiconductor layer 13 is for example illustrated in FIG. 2(b).

In step 103, when the semiconductor layer 13 is a polycrystalline silicon layer, an amorphous silicon layer may be deposited on the buffer layer 18 through CVD or other methods, and then the amorphous silicon is crystallized into polycrystalline silicon via Excimer laser annealing (ELA) or solid phase crystallization (SPC) and similar methods. After that, the required polycrystalline silicon pattern is formed through a patterning process, which comprises photoresist coating, exposing, developing, etching, photoresist peeling and so on.

Step 104: forming a gate insulation layer 14 on the semiconductor layer 13.

The gate insulation layer 14 may be deposited on the semiconductor layer 13 through CVD or other methods. The gate insulation layer 14 may be a silicon oxide layer, a silicon nitride layer or a composite insulation layer comprising a silicon oxide layer and a silicon nitride layer, which will not be limited by the embodiment of the invention.

Step 105: forming a gate metal layer 21 on the gate insulation layer 14; a pattern of the gate metal layer 21 is for example illustrated in FIG. 2(c) and comprises a gate electrode, a gate line and a common electrode line. The numeral 211 represents the gate electrode and the gate line (Gate), the numeral 212 represents the common electrode line (Gate Metal Vcom).

In step 105, a metal layer may be formed on the gate insulation layer 14 via physical vapor deposition (PVD) or other methods, and then patterns of the gate electrode, the gate line and the common electrode line may be formed at the same time through a patterning process which comprises photoresist coating, exposing, developing, etching, photoresist peeling and so on.

The gate metal layer may be an aluminum layer, a tungsten layer, a chrome layer or an electro-conductive layer of other metals or metal compounds, which will not be limited by the embodiment of the invention.

Step 106: forming an interlayer dielectric layer 15 on the gate metal layer 21.

The interlayer dielectric layer 15 may be deposited on the gate metal layer 21 using CVD or other methods, so as the protect the gate metal layer 21 and isolate the gate metal layer 21 from the subsequent SD metal layer 16. The interlayer dielectric layer 15 may be made of materials such as silicon oxide, silicon nitride, which will not be limited by the embodiment of the invention.

Step 107: forming at least one first via hole 151 penetrating to the metal shield layer 12 in the interlayer dielectric layer 15, the gate insulation layer 14 and the buffer layer 18; a pattern of the formed first via hole 151 is illustrated for example in FIG. 2(d).

It is noted that a source electrode via hole and a drain electrode via hole (for schematic diagram of the source electrode via hole and the drain electrode via hole please refer to FIG. 2(d), specifically they are indicated with the numeral 152) for electrically connecting the semiconductor layer 13 respectively to the TFT source electrode and the TFT drain electrode may also be formed in the interlayer dielectric layer 15 and the gate insulation layer 14, at the same time as forming the first via hole 151.

In step 107, the first via hole 151, the source electrode via hole and the drain electrode via hole may be formed with one or more patterning processes, which will not be limited by the embodiment of the invention. When the above via holes are formed via a single patterning process, via holes of different depths may be formed by controlling etching parameters.

Step 108: forming a SD metal layer 16 in the first via hole 151 and on the interlayer dielectric layer 15 having the first via hole 151; a pattern of the formed SD metal layer 16 may be as illustrated in FIG. 2(e).

In step 108, an electro-conductive material may be deposited on the surface of interlayer dielectric layer 15 having the source electrode via hole, the drain electrode via hole and the first via hole 151, and then the SD metal layer 16 with a predefined pattern is formed through a patterning process which comprises photoresist coating, exposing, developing, etching, photoresist peeling and so on, wherein the electro-conductive material may be aluminum, tungsten, chrome or other metal and metal compounds, which will not be limited by the embodiment of the invention.

In the embodiment of the invention, the SD metal layer 16 for example may comprise two parts: one part being a strip metal layer, normally referred to as the data line, the other part being a square metal layer, normally referred to as the SD pad; the horizontal projection region of the SD pad on the base substrate 11 overlaps that of the first via hole 151 on the base substrate 11, that is, the first via hole 151 is formed in the interlayer dielectric layer 15, the gate insulation layer 14 and the buffer layer 18 under the SD pad.

Step 109: forming a planarized layer 19 on the SD metal layer 16.

The planarized layer 19 may be formed on the SD metal layer 16 via CVD or other methods. The planarized layer 19 may be an insulation layer made of an inorganic material or an organic material, which will not be limited by the embodiment of the invention.

Step 110: forming a planarized layer via hole 191 (a second via hole) directly penetrating to the SD metal layer 16 in the planarized layer 19; a pattern of the planarized layer via hole 191 is illustrated in FIG. 2(f).

After depositing the planarized layer 19 on the SD metal layer 16, the planarized layer via hole 191 with a predefined shape may be formed through a patterning process which comprises photoresist coating, exposing, developing, etching, photoresist peeling and so on. A cross section of the planarized layer via hole 191 may be in the shape of a circle, a square, a triangle, a trapezoid or other polygon, which will not be limited by the embodiment of the invention. In FIG. 2(f), the planarized layer via hole 191 is in the shape of a square.

Step 111: forming a common electrode layer 22 on the planarized layer 19; a pattern of the formed common electrode layer 22 is illustrated in FIG. 2(g).

A transparent electro-conductive film layer may be deposited on the planarized layer 19 via CVD or other methods, and then the common electrode layer 22 with a predefined pattern may be formed through a patterning process which comprises photoresist coating, exposing, developing, etching, photoresist peeling and so on.

The common electrode layer 22 may be made of for example a transparent electro-conductive film, and a material of the transparent electro-conductive film may be ITO, AZO, which will not be limited in the embodiment of the invention.

Step 112: forming a passivation layer 20 on the common electrode layer 22, and forming a passivation layer via hole 201 (a third via hole) corresponding to the planarized layer via hole 191 and penetrating to the SD metal layer 16 in the passivation layer 20; a pattern of the formed passivation layer via hole 201 is illustrated in FIG. 2(h).

The passivation layer 20 may be formed on the common electrode layer 22 via CVD or other methods, and the passivation layer via hole 201 with a predefined shape is then formed in the passivation layer 20 through a pattering process which comprises photoresist coating, exposing, developing, etching, photoresist peeling and so on.

It is noted that the size of the passivation layer via hole 201 is normally smaller than that of the planarized layer via hole 191. Moreover, a cross section of the passivation layer via hole 201 may be in the shape of a circle, a square, a triangle, a trapezoid or other polygon, which will not be limited by the embodiment of the invention. In FIG. 2(h), the planarized layer via hole 191 is for example in the shape of a square.

The passivation layer 20 may be an insulation layer made of an inorganic material or an organic material, which will not be limited by the embodiment of the invention.

Step 113: forming a pixel electrode layer 17 on the passivation layer 20; a pattern of the formed pixel electrode layer 17 is illustrated in FIG. 2(i).

A transparent electro-conductive material layer may be deposited on the passivation layer 20 having the passivation layer via hole 201 via CVD or similar methods, and then the pixel electrode layer 17 with a predefined pattern is formed through a patterning process which comprises photoresist coating, exposing, developing, etching, photoresist peeling and so on.

It is noted that the formed pixel electrode layer 17 is located in the passivation layer via hole 201 and on the passivation layer 20, and is electrically connected to the metal shield layer 12 by way of the SD metal layer 16 in the first via hole 151.

Figure 3:
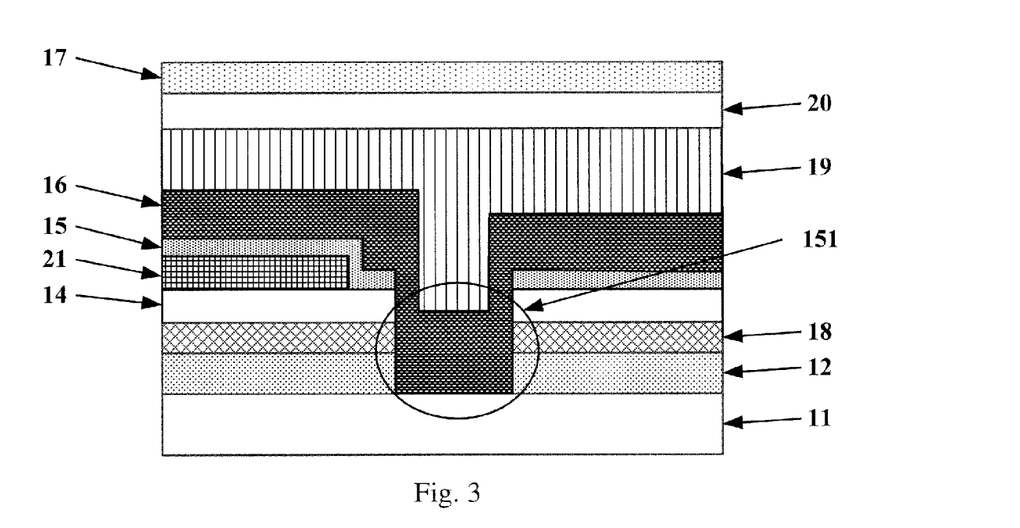
FIG. 3 schematically illustrates a first cross section of an array substrate in accordance with Embodiment 2 of the invention.
Figure 4:
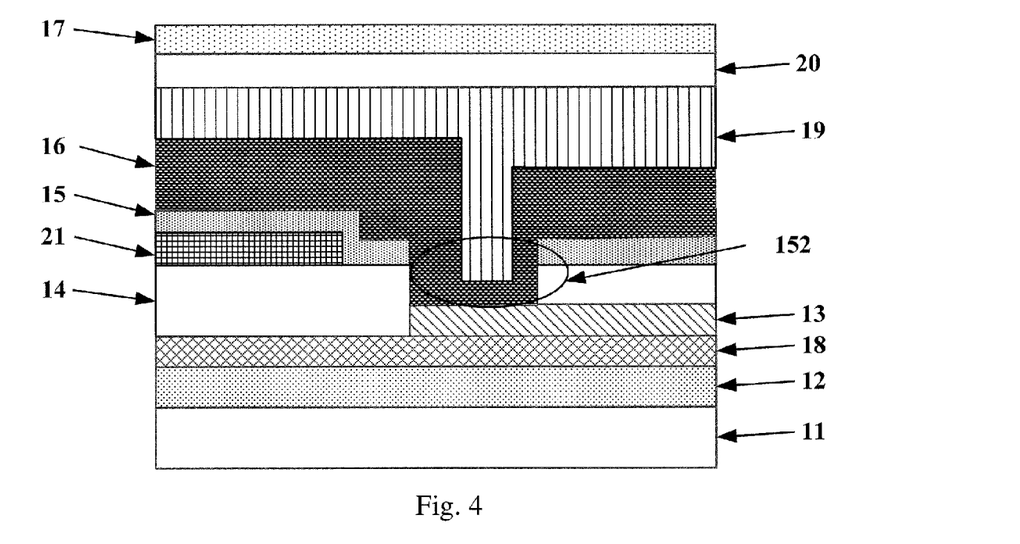
FIG. 4 schematically illustrates a second cross section of an array substrate in accordance with Embodiment 2 of the invention.
Figure 5:
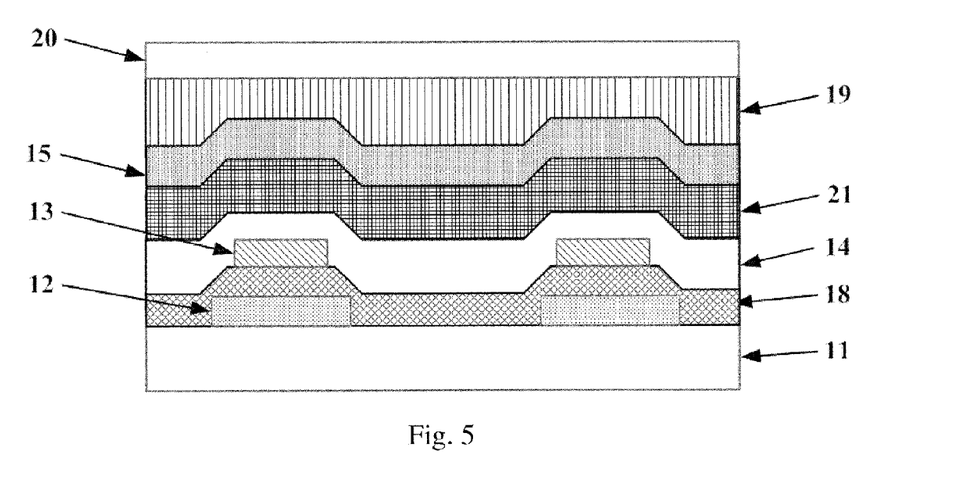
FIG. 5 schematically illustrates a third cross section of an array substrate in accordance with Embodiment 2 of the invention.

That is to say, the array substrate in accordance with Embodiment 1 of the invention may be obtained after the above steps 101 to 112; a schematic cross section of the obtained array substrate are as illustrated in FIG. 1 and FIGS. 3 to 5, wherein FIG. 1 corresponds to a cross section taken along A-A' of FIG. 2(i), FIG. 3 corresponds to a cross section taken along B-B' of FIG. 2(i), FIG. 4 corresponds to a cross section taken along C-C' of FIG. 2(i), FIG. 5 corresponds to a cross section taken along D-D' of FIG. 2(i).

In the method for fabricating the array substrate provided by the Embodiment 2 of the invention, the via hole penetrating to the metal shield layer is formed in the interlayer dielectric layer, the gate insulation layer and the buffer layer, which allows the pixel electrode to be electrically connected to the metal shield layer via the SD metal layer, which further allows the common electrode line to form the storage capacitance with the SD metal layer and to form the storage capacitance with the metal shield layer, thereby increasing the storage capacitance of the array substrate, improving the voltage holding ratio of the pixel of the array substrate and eliminating defects such as flicker of the array substrate, thus, the quality of the array substrate and of the display device are both increased.

It is noted that the embodiments of the invention are described with reference to an exemplary top-gate TFT having a polycrystalline silicon layer as the semiconductor layer, however, the embodiments of the invention are also applicable to TFTs having amorphous silicon layer as the semiconductor layer. Moreover, for a bottom-gate TFT or TFTs with other configuration variants, the storage capacitance may be increased by increasing an opposing area, which therefore is within the scope of the embodiments of the invention.

What are described above is related to the illustrative embodiments of the disclosure only and not limitative to the scope of the disclosure; the scopes of the disclosure are defined by the accompanying claims.

What is claimed is:

1. An array substrate, comprising a base substrate, and further comprising a metal shield layer, a semiconductor layer, a gate insulation layer, a gate metal layer, an interlayer dielectric layer, a source-drain metal layer and a pixel electrode layer sequentially formed on the base substrate, wherein
   at least one first via hole penetrating to the metal shield layer is formed in the interlayer dielectric layer and the gate insulation layer;
   the source-drain metal layer is formed in the at least one first via hole and on the interlayer dielectric layer having the at least one first via hole, and
   the gate metal layer comprises patterns of a common electrode line, and the common electrode line in the gate metal layer is sandwiched between the source-drain metal layer and the metal shield layer, a perpendicular projection of the common electrode line on the base substrate overlaps with a perpendicular projection of the metal shield layer on the base substrate and a perpendicular projection of the source-drain metal layer on the base substrate.

2. The array substrate of claim 1, wherein the source-drain metal layer overlays an inner wall of the at least one first via hole and is electrically connected to the metal shield layer.

3. The array substrate of claim 1, wherein a cross section of the at least one first via hole is in shape of a circle, a square, a triangle or a trapezoid.

4. The array substrate of claim 1, further comprising:
a buffer layer formed between the metal shield layer and the semiconductor layer, the at least one first via hole is formed in the interlayer dielectric layer, the gate insulation layer and the buffer layer.

5. The array substrate of claim 1, wherein the source-drain metal layer comprises patterns of a source electrode, a drain electrode and a data line.

6. The array substrate of claim 5, wherein both a source electrode via hole and a drain electrode via hole are formed in the interlayer dielectric layer and the gate insulation layer, the source electrode via hole and the drain electrode via hole being configured for electrically connecting the semiconductor layer respectively to the source electrode and the drain electrode.

7. The array substrate of claim 1, further comprising:
a planarized layer, a common electrode layer and a passivation layer sequentially formed between the source-drain metal layer and the pixel electrode layer;
wherein a second via hole and a third via hole which correspond to each other and penetrate to the source-drain metal layer are respectively formed in the planarized layer and the passivation layer;
the pixel electrode layer is formed in the third via hole and on the passivation layer having the third via hole.

8. The array substrate of claim 1, wherein the semiconductor layer is a polycrystalline silicon layer.

9. The array substrate of claim 1, wherein the gate metal layer further comprises patterns of a gate electrode, and a gate line.

10. A display device comprising the array substrate of claim 1.

11. A method for fabricating an array substrate, comprising:
sequentially forming a metal shield layer, a semiconductor layer, a gate insulation layer, a gate metal layer, an interlayer dielectric layer on a base substrate;
forming at least one first via hole in the interlayer dielectric layer and the gate insulation layer, the at least one first via hole penetrating to the metal shield layer;
forming a source-drain metal layer in the at least one first via hole and on the interlayer dielectric layer having the at least one first via hole, wherein
the gate metal layer comprises patterns of a common electrode line, and the common electrode line in the gate metal layer is sandwiched between the source-drain metal layer and the metal shield layer, a perpendicular projection of the common electrode line on the base substrate overlaps with a perpendicular projection of the metal shield layer on the base substrate and a perpendicular projection of the source-drain metal layer on the base substrate.

12. The method of claim 11, further comprising forming a pixel electrode layer above the source-drain metal layer.

13. The method of claim 11, wherein the semiconductor layer is a polycrystalline silicon layer; the method further comprises the following step after forming the metal shield layer and before forming the semiconductor layer:
forming a buffer layer on the metal shield layer, wherein the at least one first via hole is formed in the interlayer dielectric layer, the gate insulation layer and the buffer layer.

14. The method of claim 11, wherein the source-drain metal layer comprises patterns of a source electrode, a drain electrode and a data line; the method further comprises the following step after forming the interlayer dielectric layer and before forming the source-drain metal layer:
forming a source electrode via hole and a drain electrode via hole in the interlayer dielectric layer and the gate insulation layer, the source electrode via hole and the drain electrode via hole are configured for electrically connecting the semiconductor layer respectively to the source electrode and the drain electrode.

15. The method of claim 12, wherein the method further comprises the following step after forming the source-drain metal layer in the first via hole and on the interlayer dielectric layer having the first via hole and before forming the pixel electrode layer above the source-drain metal layer:
sequentially forming a planarized layer, a common electrode layer and a passivation layer on the source-drain metal layer;
wherein a second via hole and a third via hole which correspond to each other and penetrate to the source-drain metal layer are respectively formed in the planarized layer and the passivation layer;
forming the pixel electrode layer above the source-drain metal layer comprises:
forming the pixel electrode layer in the third via hole and on the passivation layer having the third via hole.

16. The array substrate of claim 2, further comprising:
a buffer layer formed between the metal shield layer and the semiconductor layer, the at least one first via hole is formed in the interlayer dielectric layer, the gate insulation layer and the buffer layer.

17. The array substrate of claim 3, further comprising:
a buffer layer formed between the metal shield layer and the semiconductor layer, the at least one first via hole is formed in the interlayer dielectric layer, the gate insulation layer and the buffer layer.

18. The array substrate of claim 2, further comprising:
a planarized layer, a common electrode layer and a passivation layer sequentially formed between the source-drain metal layer and the pixel electrode layer;
wherein a second via hole and a third via hole which correspond to each other and penetrate to the source-drain metal layer are respectively formed in the planarized layer and the passivation layer;
the pixel electrode layer is formed in the third via hole and on the passivation layer having the third via hole.

19. The array substrate of claim 4, further comprising:
a planarized layer, a common electrode layer and a passivation layer sequentially formed between the source-drain metal layer and the pixel electrode layer;
wherein a second via hole and a third via hole which correspond to each other and penetrate to the source-drain metal layer are respectively formed in the planarized layer and the passivation layer;
the pixel electrode layer is formed in the third via hole and on the passivation layer having the third via hole.

20. The array substrate of claim 6, further comprising:
a planarized layer, a common electrode layer and a passivation layer sequentially formed between the source-drain metal layer and the pixel electrode layer;
wherein a second via hole and a third via hole which correspond to each other and penetrate to the source-drain metal layer are respectively formed in the planarized layer and the passivation layer;
the pixel electrode layer is formed in the third via hole and on the passivation layer having the third via hole.

* * * * *